US009329654B2

United States Patent
Hutten et al.

(10) Patent No.: US 9,329,654 B2
(45) Date of Patent: May 3, 2016

(54) SYSTEM AND METHOD FOR ONE-LINE POWER MAPPING OF INFORMATION HANDLING SYSTEMS IN A DATACENTER

(71) Applicants: James M. Hutten, Austin, TX (US); George G. Richards, III, Round Rock, TX (US)

(72) Inventors: James M. Hutten, Austin, TX (US); George G. Richards, III, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 404 days.

(21) Appl. No.: 13/656,146

(22) Filed: Oct. 19, 2012

(65) Prior Publication Data

US 2014/0115353 A1   Apr. 24, 2014

(51) Int. Cl.
G06F 1/00 (2006.01)
G06F 1/26 (2006.01)
H05K 7/14 (2006.01)
G06F 1/32 (2006.01)

(52) U.S. Cl.
CPC ............... *G06F 1/263* (2013.01); *G06F 1/266* (2013.01); *H05K 7/1492* (2013.01); *G06F 1/32* (2013.01); *G06F 2200/261* (2013.01)

(58) Field of Classification Search
CPC ..................................... G06F 1/32; G06F 1/26
See application file for complete search history.

(56) References Cited

U.S. PATENT DOCUMENTS

| | | |
|---|---|---|
| 5,335,985 A | 8/1994 | Baur |
| 5,434,775 A | 7/1995 | Sims et al. |
| 5,505,533 A | 4/1996 | Kammersqard et al. |
| 5,774,668 A | 6/1998 | Choquier et al. |
| 5,805,442 A | 9/1998 | Crater et al. |
| 5,869,820 A | 2/1999 | Chen et al. |
| 5,910,776 A | 6/1999 | Black |
| 5,913,034 A | 6/1999 | Malcolm |
| 5,926,463 A | 7/1999 | Ahearn et al. |
| 5,956,665 A | 9/1999 | Martinez et al. |
| 5,956,723 A | 9/1999 | Zhu |
| 5,959,012 A | 9/1999 | Simonian et al. |
| 6,057,981 A | 5/2000 | Fish et al. |
| 6,112,246 A | 8/2000 | Horbal et al. |
| 6,131,119 A | 10/2000 | Fukui |
| 6,167,448 A | 12/2000 | Hemphill et al. |
| 6,282,175 B1 | 8/2001 | Steele et al. |
| 6,601,084 B1 | 7/2003 | Bhaskaran et al. |
| 6,654,347 B1 | 11/2003 | Wiedeman et al. |
| 6,714,977 B1 | 3/2004 | Fowler et al. |
| 6,826,714 B2 | 11/2004 | Coffey et al. |
| 7,696,506 B2 | 4/2010 | Lung |
| 7,720,987 B2 | 5/2010 | Penk et al. |
| 8,037,330 B2 | 10/2011 | Livescu et al. |
| 2002/0095487 A1 | 7/2002 | Day et al. |
| 2003/0046339 A1 | 3/2003 | Ip |

(Continued)

*Primary Examiner* — Phil Nguyen
(74) *Attorney, Agent, or Firm* — Larson Newman, LLP

(57) ABSTRACT

A method of one-line power mapping in a datacenter includes providing from a management system a pre-defined pattern to a rack system, in response to providing the pre-defined pattern, directing the rack system to enable a power supply unit of the rack system and to modulate a power usage of the rack system to encode the pre-defined pattern onto a power cable, wherein the power supply unit receives operating power from a power distribution unit via the power cable, receiving at the management system a power level signal from the power distribution unit, decoding at the management system the pre-defined pattern from the power level signal, and determining that the rack system is connected to the power distribution unit in response to decoding the pre-defined pattern.

17 Claims, 5 Drawing Sheets

(56) References Cited

U.S. PATENT DOCUMENTS

| | | | |
|---|---|---|---|
| 2007/0143636 A1* | 6/2007 | Bailey | H02J 1/00 713/300 |
| 2008/0317021 A1* | 12/2008 | Ives et al. | 370/389 |
| 2009/0189774 A1* | 7/2009 | Brundridge | H02J 13/001 340/654 |
| 2009/0217073 A1* | 8/2009 | Brech | G06F 11/30 713/340 |
| 2009/0307515 A1 | 12/2009 | Bandholz et al. | |
| 2010/0027687 A1* | 2/2010 | De Natale | H02H 1/0076 375/259 |
| 2010/0106154 A1 | 4/2010 | Harley et al. | |
| 2013/0013938 A1* | 1/2013 | Abdelsamie | G06F 1/26 713/310 |

* cited by examiner

SYSTEM AND METHOD FOR ONE-LINE POWER MAPPING OF INFORMATION HANDLING SYSTEMS IN A DATACENTER

FIELD OF THE DISCLOSURE

This disclosure relates generally to information handling systems, and relates more particularly to one-line power mapping in a datacenter.

BACKGROUND

As the value and use of information continues to increase, individuals and businesses seek additional ways to process and store information. One option is an information handling system. An information handling system generally processes, compiles, stores, or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, data storage systems, and networking systems. An information handling system can include virtual machines that run operating systems and applications on a common host system.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are illustrated and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion focuses on specific implementations and embodiments of the teachings. This focus is provided to assist in describing the teachings, and should not be interpreted as a limitation on the scope or applicability of the teachings. However, other teachings can be used in this application. The teachings can also be used in other applications, and with several different types of architectures, such as distributed computing architectures, client/server architectures, or middleware server architectures and associated resources.

Figure 1:
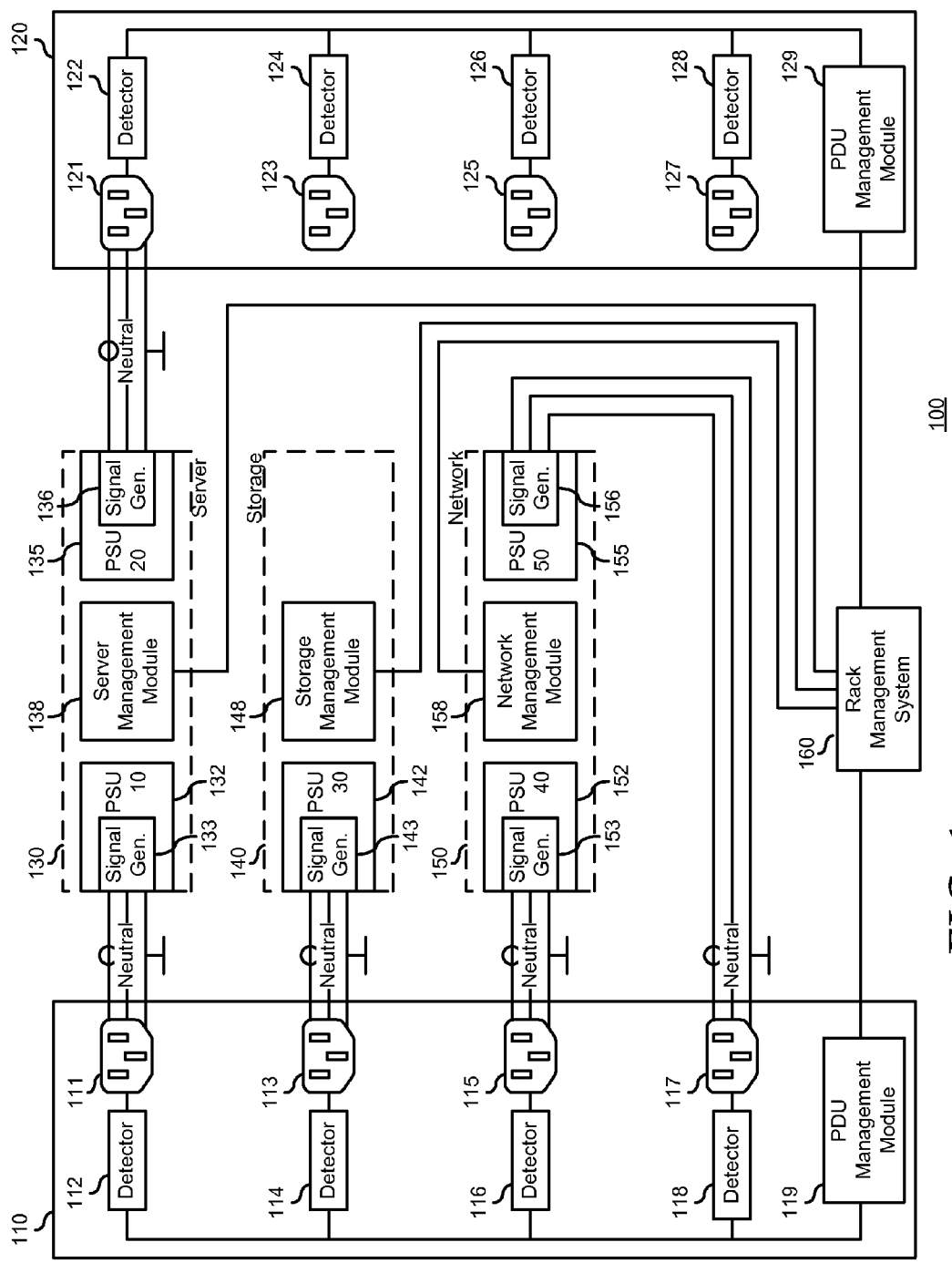
FIG. 1 is a block diagram of a rack according to an embodiment of the present disclosure.

FIG. 1 illustrates a rack 100 for one or more information handling systems. For purpose of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic, and operates to execute code. Additional components of the information handling system may include one or more storage devices that can store code, one or more communications ports for communicating with external devices as well as various input and output (I/O) devices, such as a keyboard, a mouse, and a video display. The information handling system may also include one or more buses operable to transmit communications between the various hardware components.

Rack 100 includes power distribution units (PDUs) 110 and 120, a server 130, a storage system 140, a network switch 150, and a rack management system 160. PDU 110 includes power receptacles 111, 113, 115, and 117 and associated power detectors 112, 114, 116, and 118 respectively, and a PDU management module 119. PDU 120 includes power receptacles 121, 123, 125, and 127 and associated power detectors 122, 124, 126, and 128 respectively, and a PDU management module 129. Server 130 includes power supply units (PSUs) 132 and 135 and a server management module 138. Storage system 140 includes PSU 142 and a storage system management module 148. Network switch 150 includes PSUs 152 and 155 and a network switch management module 158.

PDUs 110 and 120 operate to receive power from a datacenter power system (not illustrated) and to provide power to one or more elements of rack 100. Thus server 130 is connected such that PSU 132 receives power from power receptacle 111 and PSU 135 receives power from power receptacle 121, storage system 140 is connected such that PSU 142 receives power from power receptacle 113, and network switch 150 is connected such that PSU 152 receives power from power receptacle 115 and PSU 155 receives power from power receptacle 117. PDUs 110 and 120 represent a wide variety of metered and monitored power distribution devices, such as PDUs, bus distribution units (BDUs), uninterruptable power supplies (UPSs), or other power distribution devices. PDUs 110 and 120 can include various power conditioning capabilities, such a voltage level shifting, rectification, voltage regulation and the like, as needed or desired. As illustrated, PSUs 132, 135, 142, 152, and 155 are connected to the respective power receptacles 111, 121, 113, 115, and 117 via 3-wire alternating current (AC) connections that include an AC phase wire, a neutral wire, and a ground wire; however this is not necessarily so, and the PSUs can be connected to the respective power receptacles in other AC or direct current (DC) configurations, as needed or desired.

PDUs 110 and 120 are metered PDUs in that each power receptacle 111, 113, 115, 117, 121, 123, 125, and 127 is associated with a respective power detector 112, 114, 116, 118, 122, 124, 126, and 128 that provides an indication of the power being supplied by the power receptacles. For example, power detectors 112, 114, 116, 118, 122, 124, 126, and 128 can determine the power supplied by the respective power receptacles as a measure of the current supplied by each power receptacle, or by other power measurement mechanisms as needed or desired. Power detectors 112, 114, 116, and 118 provide the indication of the power being supplied by the respective power receptacles to PDU management module 119, and power detectors 122, 124, 126, and 128 provide the indication of the power being supplied by the respective power receptacles to PDU management module 129. In a particular embodiment, power detectors 112, 114, 116, 118, 122, 124, 126, and 128 provide analog power indications such as current measurement signals to the respective PDU management modules 119 and 129, and the PDU management modules convert the analog power indications to digital values. In another embodiment, power detectors 112, 114, 116, 118, 122, 124, 126, and 128 convert the power indications to the digital values.

PDUs 110 and 120 are managed PDUs in that the power indications and other information are provided via PDU management modules 119 and 129 to rack management system 160, and the rack management system can monitor and control the operations of the PDUs via the PDU management modules. For example, PDU management module 119 can provide an indication to rack management system 160 that power is being supplied on each of power receptacles 111, 113, 115, and 117, and PDU management module 129 can provide an indication that power is only being supplied on power receptacle 121. Here rack management system 160 can determine that the power distribution within rack 100 is not balanced, and can direct PDUs 110 and 120 to provide visible indications, such as a red indicator lamp on PDU 110 and a green indicator lamp on PDU 120, that the configuration of power connections needs to be rearranged. In response, a technician can look for the visible indications and can rearrange the power connections to better balance the power distribution in rack 100.

In a particular embodiment, PDUs 110 and 120 are configured to receive information via power receptacles 111, 113, 115, 117, 121, 123, 125, and 127, where the information is encoded by modulating power usage of the power supply devices that are connected to the receptacles, as described more fully below. For example, server 130, storage system 140, and network switch 150 can enter operating modes that draw inrush currents into respective PSUs 132, 135, 142, 152, and 155 in such a way that the power usage is recognized by PDUs 110 and 120 as including encoded information. Thus, server 130 can shut down PSU 135 and enter an operating mode in such a way to encode a signal that includes information on the power connection between PSU 132 and power receptacle 111, and can shut down PSU 132 and enter the operating mode in such a way to encode a signal that includes information on the power connection between PSU 135 and power receptacle 121. Similarly, storage system 140 can encode a signal that includes information on the power connection between PSU 142 and power receptacle 113, and network switch 150 can encode signals that include information on the power connection between PSU 152 and power receptacle 115, and on the power connection between PSU 155 and power receptacle 117. An exemplary embodiment of an operating mode that draws an inrush current includes running a program that has the effect of alternately increasing and decreasing the power load on a portion of the system, such as CPU power, I/O power, storage device power, or the like, or directing a device of the system to alternately operate at a high power level and a low power level, such as a system cooling fan or the like. In a particular embodiment, the operating mode can be initiated by directing a system virtual machine manager to instantiate one or more virtual machines that include workloads that operate to sequentially increase and decrease the power loads.

The encoded information for each PSU 132, 135, 142, 152, and 155 can include a unique identification of the PSUs. The unique identification of each PSU 132, 135, 142, 152, and 155 can be decoded by the receiving power detector 112, 114, 116, 118, or 122, the power indications from each power detector can be decoded by the respective PDU management module 119 or 129, or the PDU management modules can forward the power indications to rack management system 160 to provide a one-line power map of rack 100, as described more fully below. The unique identification for each PSU 132, 135, 142, 152, and 155 can include a service tag number for each PSU, a part/model number and serial number for each PSU, other field replaceable unit (FRU) information, or another unique identifier, as needed or desired.

In a particular embodiment, server management module 138, storage system management module 148, and network switch management module 158 represent managed service processors associated respectively with server 130, storage system 140, and network switch 150, and that are networked together with rack management system 160 via a dedicated management network. For example, a managed service processor can include a baseboard management controller (BMC), an integrated Dell remote access controller (iDRAC), another managed service processor, or a combination thereof. Here, management modules 138, 148, and 158 determine the unique identifications for their associated PSUs 132, 135, 142, 152, and 155, and communicate the unique identification to rack management system 160. In this way, not only can rack management system 160 determine that the power distribution within rack 100 is not balanced, but the rack management system can also determine whether or not server 130 and network switch 150 are powered redundantly, that is with one PSU connected to each of PDUs 110 and 120. In another embodiment, server management module 138, storage system management module 148, and network switch management module 158 represent managed service applications associated respectively with server 130, storage system 140, and network switch 150, and that are networked together with rack management system 160 via a common data network for rack 100.

For example, network switch 150 can shut down PSU 155 and enter an operating mode that operates to modulate the power usage of PSU 152 to encode the unique identification of the PSU onto the connection to power receptacle 115. In a particular embodiment, power detector 116 decodes the encoded information from PSU 152 and sends the unique identification of the PSU to PDU management module 119. In another embodiment, the encoded information is decoded by PDU management module 119. In yet another embodiment, the encoded information is decoded by rack management system 160. In any case, rack management system 160 determines that PSU 152 is connected to power receptacle 115. Similarly, network switch 150 can shut down PSU 152 and enter the operating mode to modulate the power usage of PSU 155 to encode the unique identification of the PSU onto the connection to power receptacle 117. In this way, rack management system 160 determines that PSUs 152 and 155 are both connected to PDU 110.

In a particular embodiment, the unique identifiers of PDUs 132, 135, 142, 152, and 155 are provided to their respective PDUs 110 and 120 on a periodic basis, such as once an hour, once a day, or another period, as needed or desired. In another embodiment, the unique identifies are provided on an as needed basis. For example, rack management system 160 can direct storage system management module 148 to initiate an identification session to encode a unique identifier for PSU 142 to power receptacle 113.

In a particular implementation, it may be needed or desired for network switch 150 to be connected to power such that PSUs 152 and 155 are each connected to a different PDU 110 and 120. Here, based upon the example above, rack management system 160 determines that both PSUs 152 and 155 are connected to PDU 110, and so the rack management system directs PDU 110 to provide a visible indication, such as a blinking red indicator lamp associated with one of power receptacles 115 and 117, indicating that the power connection to the power receptacles are to PSUs 152 and 155, that is, that the power connections to network switch 150 are not redundant. For example, a technician can look for the visible indication and can unplug PSU 155 from that power receptacle. Further, rack management system 160 can direct PDU 120 to provide a visible indication, such as a blinking green indicator lamp associated with one of the unused power receptacles 123, 125, and 127, indicating that the unplugged PSU 155 is to be plugged into that power receptacle in order to provide redundant power connections to network switch 150. For example, the technician can look for the visible indication and can plug PSU 155 into that power receptacle.

In a particular embodiment, PDUs 110 and 120 are each associated with a different phase of a three-phase electrical service. For example, rack 100 may be associated with a datacenter that includes one or more additional racks, each with one or more PDUs similar to PDUs 110 and 120, and that are associated with one of the phases of the three-phase electrical service. The one or more additional racks can also include one or more additional systems similar to server 130, storage system 140, and network switch 150. Here, rack management system 160 can determine the loading of all of the servers in the datacenter, and can further determine a one-line power map of the datacenter. Further, rack management system 160 can determine from the one-line power map of the datacenter, whether or not the three phases of the three-phase electrical service are balanced, and can provide visible indications that alert a technician to reconfigure the power connections within rack 100 and the one or more additional racks, in order to better balance the power loads on each phase of the three-phase electrical service.

In a particular embodiment, PDUs 110 and 120 operate to receive detection parameters from rack management system 160. For example, the detection parameters can include an expected voltage or current transition step size that is associated with a bit of information, a transition frequency or data window period, an expected set-up or initialization sequence, another detection parameter, or a combination thereof. In this way, PDUs 110 and 120 can be configured to detect encoded information from a variety of different PSUs 132, 135, 142, 152, or 155 that may each be configured to provide the encoded information in a different way. In particular, rack management system 160 can poll management modules 138, 148, and 158 to determine the configurations of respective PSUs 132, 135, 142, 152, and 155, and can provide the detection parameters associated with each PSU to PDUs 110 and 120. In another embodiment, rack management system 160 polls management modules 138, 148, and 158 to determine the configurations of respective PSUs 132, 135, 142, 152, and 155, rack management system 160 receives the detected power information from power detectors 112, 114, 116, 118, 122, 124, 126, and 128, and rack management system 160 decodes the encoded information from the detected power information. In this way PDUs 110 and 120 operate without decoding the encoded information, and rack management system 160 generates the one-line power map for rack server 100.

Figure 2:
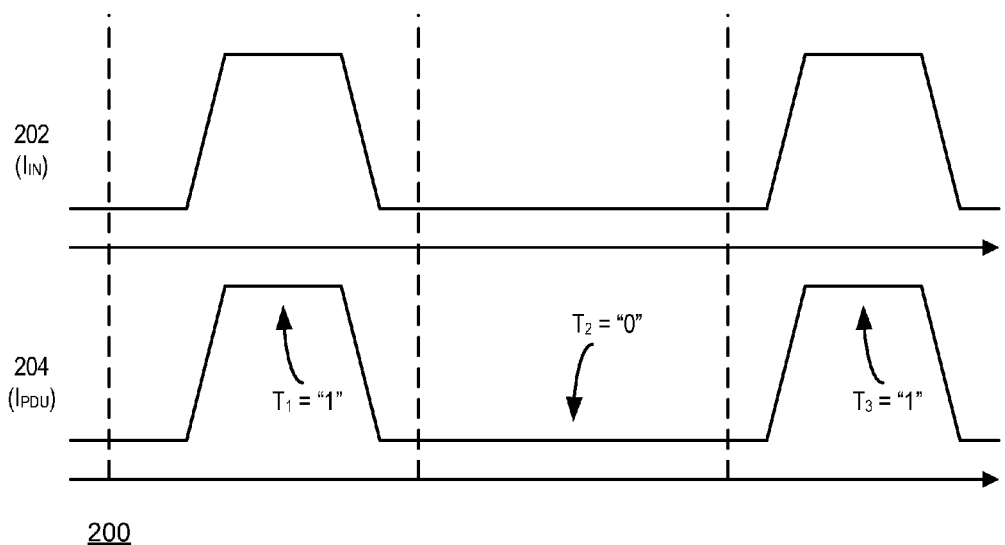
FIG. 2 is a diagram of signal traces of a power supply according to an embodiment of the present disclosure.

FIG. 2 illustrates information encoded by modulating power usage of a system similar to server 130, storage system 140, or network switch 150, and that is connected to a power receptacle of a metered and monitored PDU similar to PDUs 110 and 120. A trace 202 illustrates an input current to the system, and a trace 204 illustrates an output current of a PDU that is connected to the system. The power load of the system is changed in a manner that encodes information on the input current of the system, and that is detected by the PDU as a change in the output current of the PDU. As such, input current trace 202 shows that the input current starts at a first current level and in a first time window $T_1$ the system enters a higher power mode and the current changes to a higher level. In response to the changed current level at $T_1$, output current trace 204 shows that the output current of the PDU also increases. In a second time window $T_2$, input current trace 202 shows that the input current has returned to the initial current level. In response to the low input current level at $T_2$, output current trace 204 shows that the output current of the PDU is also low. Finally, in a third time window $T_3$, input current trace 202 shows that the input current again rises to the higher level. In response to the changed voltage level at $T_3$, output current trace 204 shows an increased current.

In a particular embodiment, the PDU detects an increased current as a logic "1", and at time window $T_1$ a first bit of information is sent from the system to the PDU. Further, the PDU detects a low current as a logic "0", and at time window $T_2$ a second bit of information is sent to the PDU. Finally, a third bit of information, a logic "1," is received by the PDU at time window $T_3$. The skilled artisan will understand that various encoding schemes can be utilized to encode information, as needed or desired. For example, no change in the current level in a particular time window can be decoded as "same as the last bit." For example, the bit sequence 0b01110001 can be encoded by a current trace that starts at a low level in a first time window, then changes to a high level in a second time window and remains at the high level through a third and a fourth time windows, then changes to a low level in a fifth time window and remains at the low level through the sixth and seventh time windows, and finally changes to a high level in the eighth time window. In another example, the information can be encoded in an 8-bit/10-bit encoding scheme, where eight bits of information are encoded in ten bits, in order to achieve a balance of the output current. Here, the difference between the count of 1s and 0s (that is, the difference between the number of high voltage levels and low voltage levels) in a string of at least twenty bits is no more than two, and there are not more than five 1s or 0s in a row (that is, the voltage levels will not remain either high or low for more than five consecutive time windows).

Figure 3:
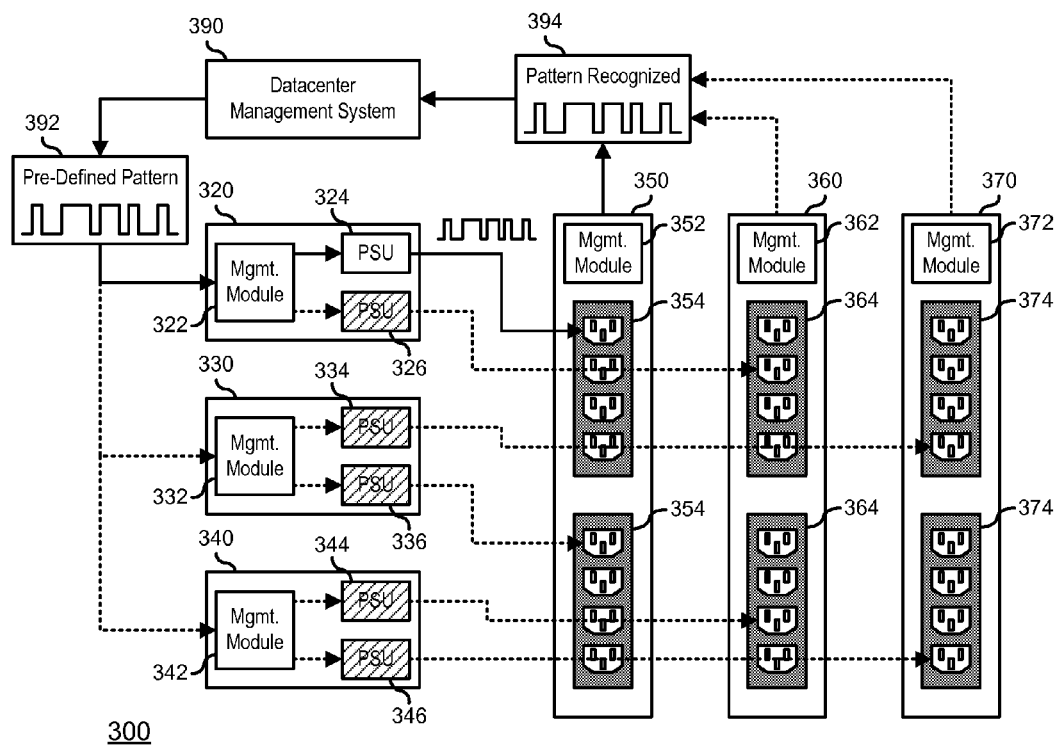
FIG. 3 is a block diagram of another rack according to an embodiment of the present disclosure.

FIG. 3 illustrates a rack 300 similar to rack 100, including systems 320, 330, and 340, and PDUs 350, 360, and 370. Rack 300 is associated with a datacenter management system 390. Systems 320, 330, and 340 each include a respective management module 322, 332, and 342, and respective PSUs 324 and 326 in system 320, PSUs 334 and 336 in system 330, and PSUs 344 and 346 in system 340. PDUs 350, 360, and 370 each include respective management modules 352, 362, and 372, and respective power receptacles 354, 364, and 374.

In operation, datacenter management system 390 provides a pre-defined pattern 392 to system 320, and directs the system to shut down PSU 326 and further directs the system to initiate the operating mode to modulate the power consumption of the system in a way that places the pre-defined pattern as a signal on the connection between PSU 324 and power receptacle 354. A power detector associated with power receptacle 354 provides an indication of the power consumed by system 320, and sends the indication to management module 352. The indication is forwarded to datacenter management system 390, which recognizes the pattern 394, thereby determining that PSU 324 is connected to PDU 350.

Datacenter management system 390 then directs system 320 to power up PSU 326 and to shut down PSU 324, and initiates the operating mode to modulate the power consumption of the system to place the pre-defined pattern as a signal on the connection between PSU 326 and power receptacle 364. A power detector associated with power receptacle 364 provides an indication of the power consumed by system 320, and sends the indication to management module 362 which forward the indication to datacenter management system 390, which recognizes the pattern 394, thereby determining that PSU 326 is connected to PDU 360. Datacenter management system 390 then proceeds to enumerate the connections between PSU 334 and PDU 370, between PSU 336 and PDU 350, between PSU 344 and PDU 360, and between PSU 346 and PDU 370, thereby enumerating a one-line power distribution map for rack 300. In a particular embodiment, pre-defined pattern 392 represents a common pattern of all steps of the enumeration of the one-line power distribution map. In another embodiment, pre-defined pattern 392 represents a different pattern for one or more steps of the enumeration of the one-line power distribution map.

Figure 4:
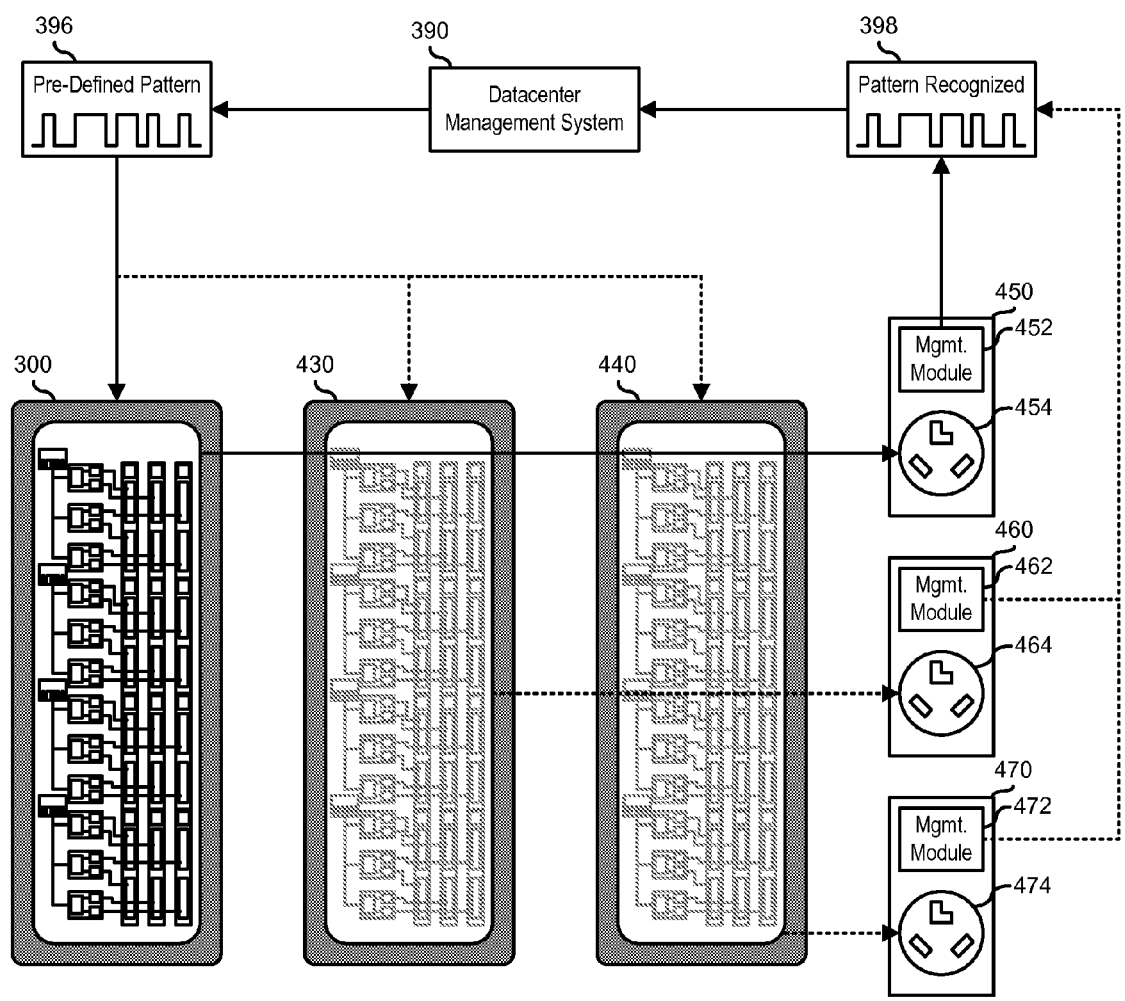
FIG. 4 is a block diagram of a data center including the rack of FIG. 3.

FIG. 4 illustrates a datacenter 400 including datacenter manager 390, rack 300, racks 430, and 440 similar to rack 300, and bus distribution units (BDUs) 450, 460, and 470. BDUs 450, 460, and 470 each include respective management modules 452, 462, and 472, and respective power receptacles 454, 464, and 474. In operation, datacenter management system 390 provides a pre-defined pattern 396 to rack 300, and directs each PSU in the rack to be powered on. Datacenter management system 390 then directs the systems of rack 300 to initiate the operating mode to modulate the power consumption of the systems in a way that places the pre-defined pattern as a signal on the connection between rack 300 and power receptacle 454. A power detector associated with power receptacle 454 provides an indication of the power consumed by rack 300, and sends the indication to management module 452. The indication is forwarded to datacenter management system 390, which recognizes the pattern 398, thereby determining that rack 300 is connected to BDU 450.

Datacenter management system 390 then provides pre-defined pattern 396 to rack 430, and directs each PSU in the rack to be powered on. Datacenter management system 390 then directs the systems of rack 430 to initiate the operating mode to modulate the power consumption of the systems in a way that places the pre-defined pattern as a signal on the connection between rack 430 and power receptacle 464. An indication of the power consumed by rack 430 is sent to management module 462 which forwards the indication to datacenter management system 390. Datacenter management system 390 recognizes the pattern 398, thereby determining that rack 430 is connected to BDU 460. Datacenter management system 390 then proceeds to enumerate the connection between rack 440 and BDU 470, thereby enumerating a one-line power distribution map for datacenter 400.

Figure 5:
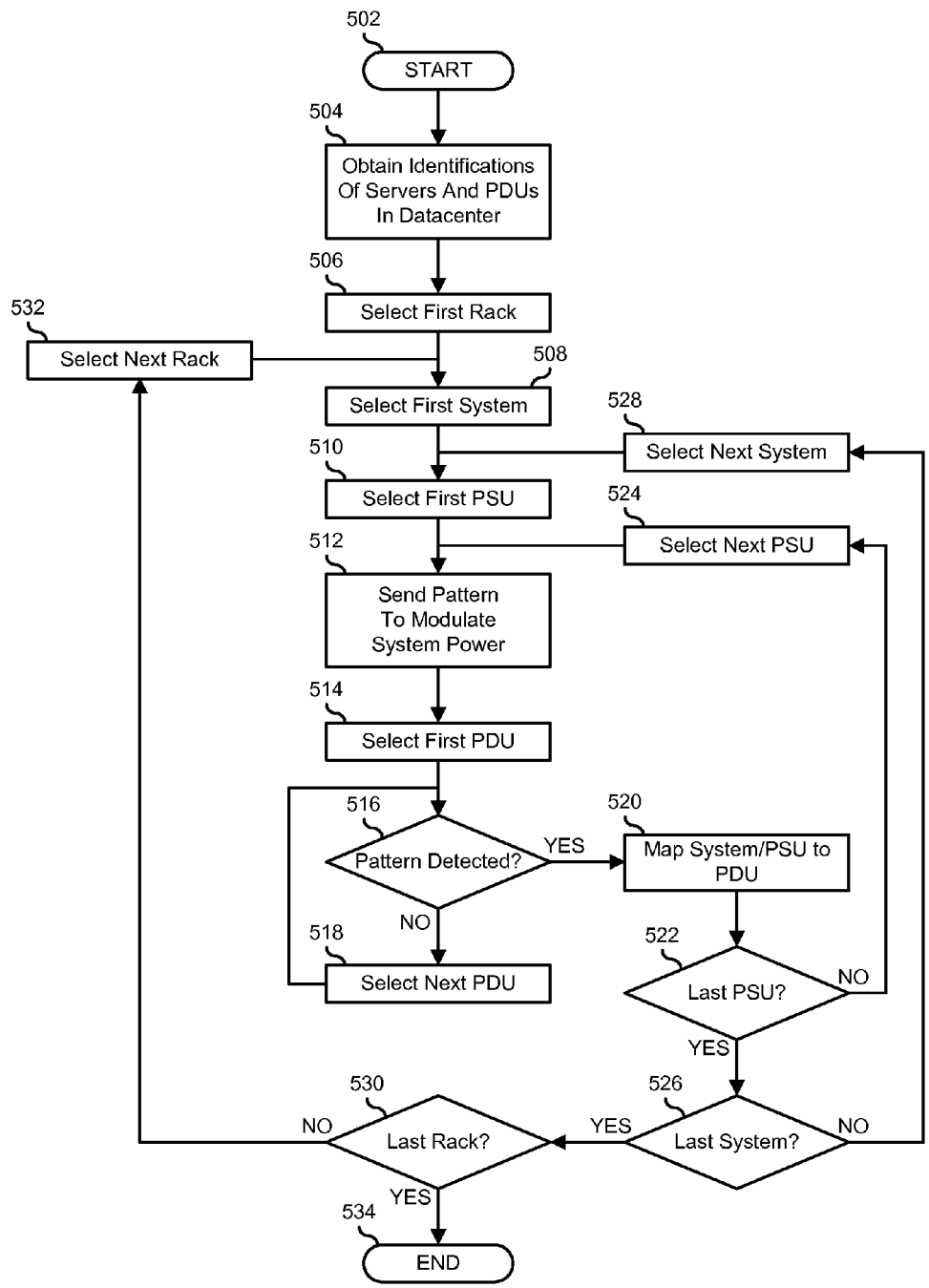
FIG. 5 is a flow diagram of a method of one-line power mapping in a datacenter according to an embodiment of the present disclosure.

FIG. 5 illustrates a method of one-line power mapping in a datacenter, starting at block 502. Identification information for each system and PDU in a datacenter is obtained in block 504. For example, a datacenter management system can poll PDU management modules and system management modules to obtain the identification information that can include a service tag number, a part/model number and serial number, other field replaceable unit (FRU) information, IP addresses, or unique identifier, as needed or desired. A first rack is selected in block 506, a first system in the rack is selected in block 508, and a first PSU in the system is selected in block 510. A pre-defined pattern is sent to the selected system to modulate the system power to send the pattern on the selected PSU to the connected PDU in block 512. For example, a datacenter management system can provide a pattern to a selected system or can launch an application that causes the system to modulate its power usage in a way to encode the pattern on the power drawn by the system.

A first PDU of the selected rack is selected in block 514, and a decision is made as to whether or not the pre-defined pattern is detected in decision block 516. For example, the datacenter management system can poll the power status indications for a first PDU of the selected rack to determine if the power status indications are fluctuating in a way that reflects the pre-defined pattern. If not, the "NO" branch of decision block 516 is taken, a next PDU of the selected rack is selected in block 518, and the method returns to decision block 516 where a decision is made as to whether or not the pre-defined pattern is detected on the next PDU. If the pre-defined pattern is detected, the "YES" branch of decision block 516 is taken and the selected rack, the selected system, and the selected PSU are mapped to the PDU from which the pre-defined pattern was detected in block 520.

A decision is made as to whether the selected PSU is the last PSU in the system in decision block 522. If not, a next PSU is selected in block 524, and the method returns to block 512 where the pre-defined pattern is sent to the selected system to modulate the system power to send the pattern on the newly selected PSU to the connected PDU. If the selected PSU is the last PSU in the system, the "YES" branch of decision block 522 is taken, and a decision is made as to whether or not the selected system is the last system in the rack in decision block 526. If not, the "NO" branch of decision block 526 is taken, a next system is selected in block 528, and the method returns to block 510 where a first PSU in the newly selected system is selected. If the selected system is the last system in the rack, the "YES" branch of decision block 526 is taken, and a decision is made as to whether or not the selected rack is the last rack in the datacenter in decision block 530. If not, the "NO" branch of decision block 530 is taken, a next rack is selected in block 532, and the method returns to block 508 where a first system in the newly selected rack is selected. If the selected rack is the last system in the rack, the "YES" branch of decision block 530 is taken, and the method ends in block 534.

Figure 6:
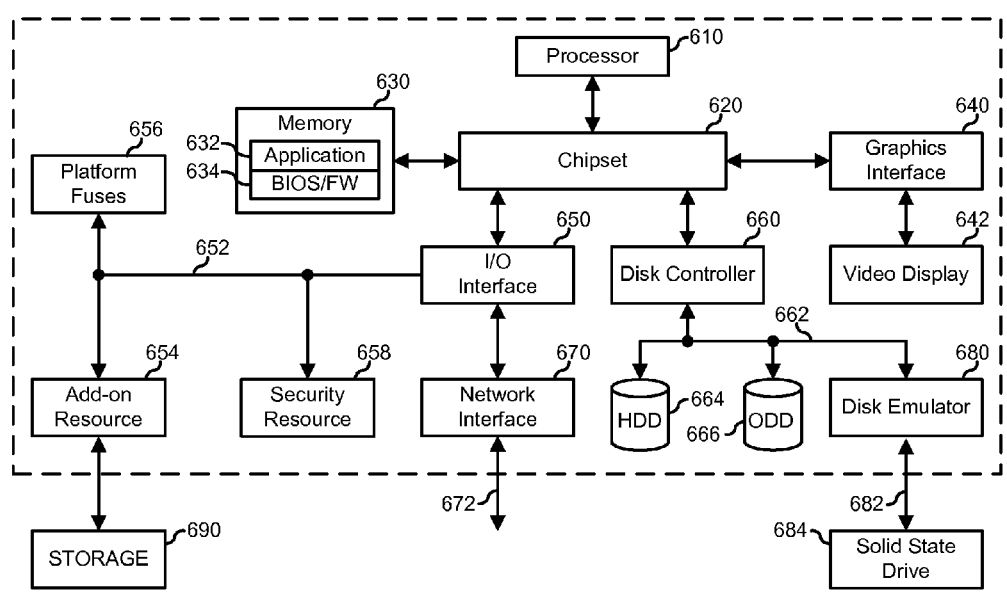
FIG. 6 is a functional block diagram illustrating an exemplary embodiment of an information handling system.

FIG. 6 illustrates an information handling system 600, including a processor 610, a chipset 620, a memory 630, a graphics interface 640, an input/output (I/O) interface 650, a disk controller 660, a network interface 670, and a disk emulator 680. In a particular embodiment, information handling system 600 is used to carry out one or more of the methods described herein. In another embodiment, one or more of the systems described herein are implemented in the form of information handling system 600.

Chipset 620 is connected to and supports processor 610, allowing the processor to execute machine-executable code. In a particular embodiment, information handling system 600 includes one or more additional processors, and chipset 620 supports the multiple processors, allowing for simultaneous processing by each of the processors and permitting the exchange of information among the processors and the other elements of the information handling system. Chipset 620 can be connected to processor 610 via a unique channel, or via a bus that shares information among the processor, the chipset, and other elements of information handling system 600.

Memory 630 is connected to chipset 620. Memory 630 and chipset 620 can be connected via a unique channel, or via a bus that shares information among the chipset, the memory, and other elements of information handling system 600. In another embodiment (not illustrated), processor 610 is connected to memory 630 via a unique channel. In another embodiment (not illustrated), information handling system 600 includes separate memory dedicated to each of the one or more additional processors. A non-limiting example of memory 630 includes static random access memory (SRAM), dynamic random access memory (DRAM), non-volatile random access memory (NVRAM), read only memory (ROM), flash memory, another type of memory, or any combination thereof.

Graphics interface 640 is connected to chipset 620. Graphics interface 640 and chipset 620 can be connected via a unique channel, or via a bus that shares information among the chipset, the graphics interface, and other elements of information handling system 600. Graphics interface 640 is connected to a video display 642. Other graphics interfaces (not illustrated) can also be used in addition to graphics interface 640 as needed or desired. Video display 642 includes one or more types of video displays, such as a flat panel display, another type of display device, or any combination thereof.

I/O interface 650 is connected to chipset 620. I/O interface 650 and chipset 620 can be connected via a unique channel, or via a bus that shares information among the chipset, the I/O interface, and other elements of information handling system 600. Other I/O interfaces (not illustrated) can also be used in addition to I/O interface 650 as needed or desired. I/O interface 650 is connected via an I/O interface 652 to one or more add-on resources 654. Add-on resource 654 is connected to a storage system 690, and can also include another data storage system, a graphics interface, a network interface card (NIC), a sound/video processing card, another suitable add-on resource or any combination thereof. I/O interface 650 is also connected via I/O interface 652 to one or more platform fuses 656 and to a security resource 658. Platform fuses 656 function to set or modify the functionality of information handling system 600 in hardware. Security resource 658 provides a secure cryptographic functionality and includes secure storage of cryptographic keys. A non-limiting example of security resource 658 includes a Unified Security Hub (USH), a Trusted Platform Module (TPM), a General Purpose Encryption (GPE) engine, another security resource, or a combination thereof.

Disk controller 660 is connected to chipset 620. Disk controller 660 and chipset 620 can be connected via a unique channel, or via a bus that shares information among the chipset, the disk controller, and other elements of information handling system 600. Other disk controllers (not illustrated) can also be used in addition to disk controller 660 as needed or desired. Disk controller 660 includes a disk interface 662. Disk controller 660 is connected to one or more disk drives via disk interface 662. Such disk drives include a hard disk drive (HDD) 664, and an optical disk drive (ODD) 666, and can include one or more disk drive as needed or desired. ODD 666 can include a Read/Write Compact Disk (R/W-CD), a Read/Write Digital Video Disk (R/W-DVD), a Read/Write mini Digital Video Disk (R/W mini-DVD), another type of optical disk drive, or any combination thereof. Additionally, disk controller 660 is connected to disk emulator 680. Disk emulator 680 permits a solid-state drive 684 to be coupled to information handling system 600 via an external interface 682. External interface 682 can include industry standard busses such as USB or IEEE 1394 (Firewire) or proprietary busses, or any combination thereof. Alternatively, solid-state drive 684 can be disposed within information handling system 600.

Network interface device 670 is connected to I/O interface 650. Network interface 670 and I/O interface 650 can be coupled via a unique channel, or via a bus that shares information among the I/O interface, the network interface, and other elements of information handling system 600. Other network interfaces (not illustrated) can also be used in addition to network interface 670 as needed or desired. Network interface 670 can be a network interface card (NIC) disposed within information handling system 600, on a main circuit board such as a baseboard, a motherboard, or any combination thereof, integrated onto another component such as chipset 620, in another suitable location, or any combination thereof. Network interface 670 includes a network channel 672 that provide interfaces between information handling system 600 and other devices (not illustrated) that are external to information handling system 600. Network interface 670 can also include additional network channels (not illustrated).

Information handling system 600 includes one or more application programs 632, and Basic Input/Output System and Firmware (BIOS/FW) code 634. BIOS/FW code 634 functions to initialize information handling system 600 on power up, to launch an operating system, and to manage input and output interactions between the operating system and the other elements of information handling system 600. In a particular embodiment, application programs 632 and BIOS/FW code 634 reside in memory 630, and include machine-executable code that is executed by processor 610 to perform various functions of information handling system 600. In another embodiment (not illustrated), application programs and BIOS/FW code reside in another storage medium of information handling system 600. For example, application programs and BIOS/FW code can reside in HDD 664, in a ROM (not illustrated) associated with information handling system 600, in an option-ROM (not illustrated) associated with various devices of information handling system 600, in storage system 690, in a storage system (not illustrated) associated with network channel 672, in another storage medium of information handling system 600, or a combination thereof. Application programs 632 and BIOS/FW code 634 can each be implemented as single programs, or as separate programs carrying out the various features as described herein.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality. The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method of one-line power mapping in a datacenter, the method comprising:
   providing, from a management system, a first pre-defined pattern to a first rack system wherein the first pre-defined pattern comprises a first sequence of bits;
   in response to providing the first pre-defined pattern, directing the first rack system to enable a first power supply unit of the first rack system and to modulate a first power usage of the first rack system to encode the first pre-defined pattern onto a first power cable, wherein the first power supply unit receives operating power from a first power distribution unit via the first power cable;
   receiving, at the management system, a first power level signal from the first power distribution unit;
   decoding, at the management system, the first pre-defined pattern from the first power level signal; and
   determining that the first rack system is connected to the first power distribution unit in response to decoding the first pre-defined pattern; and
   providing, from the management system, the first pre-defined pattern to a second rack system;
   in response to providing the first pre-defined pattern to the second rack system, directing the second rack system to enable a second power supply unit of the second rack system and to modulate a second power usage of the second rack system to encode the first pre-defined pattern onto a second power cable, wherein the second power supply unit receives operating power from a second power distribution unit via the second power cable;
   receiving, at the management system, a second power level signal from the second power distribution unit;
   decoding, at the management system, the first pre-defined pattern from the second power level signal; and
   determining that the second rack system is connected to the second power distribution unit in response to decoding the first pre-defined pattern.

2. The method of claim 1, further comprising:
   in further response to providing the first pre-defined pattern, directing the first rack system to enable a second power supply unit of the first rack system and to modulate a second power usage of the first rack system to encode the first pre-defined pattern onto a second power cable, wherein the second power supply unit receives operating power from a second power distribution unit via the second power cable;
   receiving, at the management system, a second power level signal from the second power distribution unit;
   decoding, at the management system, the first pre-defined pattern from the second power level signal; and
   determining that the first rack system is connected to the second power distribution unit in response to decoding the first pre-defined pattern.

3. The method of claim 2, wherein the first power distribution unit is the same as the second power distribution unit, the method further comprising:
   directing, from the management system, the first power distribution unit to provide a second indication at a first receptacle, wherein the second indication indicates that the first rack system is connected to the first power distribution unit via both the first power supply unit and the second power supply unit, and wherein the first power cable is connected to the first receptacle; and
   directing from the management system, a third power distribution unit to provide a third indication at a second receptacle, wherein the third indication indicates that the first power supply unit should be connected via the first cable to the third power distribution unit, and wherein the third power distribution unit is different from the first power distribution unit.

4. The method of claim 1, wherein:
the first rack system and the second rack system are included in a rack of the datacenter; the method further comprising:
providing, from the management system, a second pre-defined pattern to the first rack system and the second rack system, wherein the second pre-defined pattern comprises a second sequence of bits;

in response to providing the second pre-defined pattern:
directing the first rack system to enable the first power supply unit; directing the second rack system to enable the second power supply unit; and
directing the first rack system and the second rack system to modulate a third power usage to encode the second pre-defined pattern onto the first power cable and on the second power cable;
receiving, at the management system, a third power level signal from a bus distribution unit;
decoding, at the management system, the second pre-defined pattern from the third power level signal; and
determining that the rack is connected to the bus distribution unit in response to decoding the second pre-defined pattern.

5. The method of claim 1, wherein in directing the first rack system to modulate the first power usage of the first rack system the method further comprises: directing the first rack system to enter an operating mode that draws an inrush current on the first power supply unit.

6. The method of claim 5, wherein the operating mode comprises running a program that alternately increases and decreases a power load on a portion of the first rack system.

7. The method of claim 6, wherein the portion of the first rack system includes at least one of a processor of the first rack system, a storage device of the first rack system, and a cooling fan of the first rack system.

8. A datacenter management system for one-line power mapping in a datacenter, the datacenter management system comprising:
a memory; and
a processor operable to:
provide a first pre-defined pattern to a first rack system, wherein the first pre-defined pattern comprises a first sequence of bits that includes a unique identification of a first power supply unit of the first rack system;
direct the first rack system to enable the first power supply unit and to modulate a first power usage of the first rack system to encode the first pre-defined pattern;
receive a first power level signal from a first power distribution unit, wherein the first power distribution unit is connected to the first power supply unit;
decode the first pre-defined pattern from the first power level signal; and
determine that the first rack system is connected to the first power distribution unit in response to decoding the first pre-defined pattern from the first power level signal; and
direct the first rack system to enable a second power supply unit of the first rack system and to modulate a second power usage of the first rack system to encode the first pre-defined pattern;
receive a second power level signal from a second power distribution unit, wherein the second power distribution unit is connected to the second power supply unit;
decode the first pre-defined pattern from the second power level signal; and
determine that the first rack system is connected to the second power distribution unit in response to decoding the first pre-defined pattern from the second power level signal.

9. The datacenter management system of claim 8, wherein:
the first power distribution unit is the same as the second power distribution unit; the processor is further operable to:
direct the first power distribution unit to provide a first indication at a first receptacle, wherein the first indication indicates that the first rack system is connected to the first power distribution unit via both the first power supply unit and the second power supply unit; and
direct a third power distribution unit to provide a second indication at a second receptacle, wherein the second indication indicates that the first power supply unit should be connected to the third power distribution unit.

10. The datacenter management system of claim 9, wherein the processor is further operable to:
provide the first pre-defined pattern to a second rack system;
direct the second rack system to enable a second power supply unit of the second rack system and to modulate a second power usage of the second rack system to encode the first pre-defined pattern;
receive a second power level signal from the second power distribution unit;
decode the first pre-defined pattern from the second power level signal; and
determine that the second rack system is connected to the second power distribution unit in response to decoding the first pre-defined pattern.

11. The datacenter management system of claim 10, wherein: the first rack system and the second rack system are included in a rack of the datacenter; and the processor is further operable to:
provide a second pre-defined pattern to the first rack system and the second rack system wherein the second pre-defined pattern comprises a second sequence of bits; in response to providing the second pre-defined pattern:
direct the first rack system to enable the first power supply unit; to enable the second power supply unit; and
direct the first rack system and the second rack system to modulate a third power usage to encode the second pre-defined pattern;
receive a third power level signal from a bus distribution unit; decode the second pre-defined pattern from the third power level signal; and
determine that the rack is connected to the bus distribution unit in response to decoding the second pre-defined pattern.

12. The datacenter management system of claim 8, wherein the processor is further operable to:
direct the first rack system to enter an operating mode that draws an inrush current on the first power supply unit, wherein the operating mode comprises running a program that alternately increases and decreases a power load on a portion of the first rack system.

13. The datacenter management system of claim 12, wherein the portion of the first rack system includes at least one of a processor of the first rack system, a storage device of the first rack system, and a cooling fan of the first rack system.

14. A non-transitory computer-readable medium including code for performing a method, the method comprising:
providing, from a management system, a first pre-defined pattern to a first rack system,
wherein the first pre-defined pattern comprises a first sequence of bits;
in response to providing the first pre-defined pattern, directing the first rack system to enable a first power supply unit of the first rack system and to modulate a first power usage of the first rack system to encode the first pre-defined pattern onto a first power cable, wherein the first power supply unit receives operating power from a first power distribution unit via the first power cable;
receiving, at the management system, a first power level signal from the first power distribution unit; decoding, at the management system, the first pre-defined pattern from the first power level signal; and determining that the first rack system is connected to the first power distribution unit in response to decoding the first pre-defined pattern; and providing, from the management system, the first pre-defined pattern to a second rack system;

in response to providing the first pre-defined pattern to the second rack system, directing the second rack system to enable a second power supply unit of the second rack system and to modulate a second power usage of the second rack system to encode the first pre-defined pattern onto a second power cable, wherein the second power supply unit receives operating power from a second power distribution unit via the second power cable;

receiving, at the management system, a second power level signal from the second power distribution unit;

decoding, at the management system, the first pre-defined pattern from the second power level signal; and determining that the second rack system is connected to the second power distribution unit in response to decoding the first pre-defined pattern.

15. The computer-readable medium of claim 14, the method further comprising:

in further response to providing the first pre-defined pattern, directing the first rack system to enable a second power supply unit of the first rack system and to modulate a second power usage of the first rack system to encode the first pre-defined pattern onto a second power cable, wherein the second power supply unit receives operating power from a second power distribution unit via the second power cable; receiving, at the management system, a second power level signal from the second power distribution unit;

decoding, at the management system, the first pre-defined pattern from the second power level signal; and determining that the first rack system is connected to the second power distribution unit in response to decoding the first pre-defined pattern.

16. The computer-readable medium of claim 15, wherein the first power distribution unit is the same as the second power distribution unit, the method further comprising:

directing, from the management system, the first power distribution unit to provide a second indication at a first receptacle, wherein the second indication indicates that the first rack system is connected to the first power distribution unit via both the first power supply unit and the second power supply unit, and wherein the first power cable is connected to the first receptacle; and directing from the management system, a third power distribution unit to provide a third indication at a second receptacle, wherein the third indication indicates that the first power supply unit should be connected via the first power cable to the third power distribution unit, and wherein the third power distribution unit is different from the first power distribution unit.

17. The computer-readable medium of claim 14, wherein: the first rack system and the second rack system are included in a rack of the datacenter; the method further comprising:

providing, from the management system, a second pre-defined pattern to the first rack system and the second rack system, wherein the second pre-defined pattern comprises a second sequence of bits;

in response to providing the second pre-defined pattern:

directing the first rack system to enable the first power supply unit; directing the second rack system to enable the second power supply; and directing the first rack system and the second rack system to modulate a third power usage to encode the second pre-defined pattern onto the first power cable and on the second power cable;

receiving, at the management system, a third power level signal from a bus distribution unit;

decoding, at the management system, the second pre-defined pattern from the third power level signal; and determining that the rack is connected to the bus distribution unit in response to decoding the second pre-defined pattern.

* * * * *